(12) United States Patent
Okabe et al.

(10) Patent No.: US 6,280,799 B1
(45) Date of Patent: Aug. 28, 2001

(54) VISCOUS SUBSTANCE DISCHARGING METHOD USING A VISCOUS SUBSTANCE DISPENSER AND PATTERN FORMING METHOD USING A VISCOUS SUBSTANCE DISPENSER

(75) Inventors: Masato Okabe; Katsunori Tsuchiya, both of Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/472,782

(22) Filed: Dec. 28, 1999

(30) Foreign Application Priority Data

Dec. 28, 1998 (JP) .................................................. 10-373962

(51) Int. Cl.⁷ ....................................................... B05D 1/32
(52) U.S. Cl. ............................. 427/466; 427/64; 427/261; 427/290
(58) Field of Search .............................. 427/466, 64, 261, 427/290

*Primary Examiner*—Bernard Pianalto
(74) *Attorney, Agent, or Firm*—Parkhurst & Wendel, L.L.P.

(57) ABSTRACT

A viscous substance dispenser is provided with a container containing a viscous substance having a viscosity in the range of 1,000 to 1,000,000 cps. The container is provided with a circular orifice or a polygonal orifice of a diameter in the range of 50 μm to 1 mm in its lower portion. An electrode is formed in a portion or the entire portion of the container. A meniscus of the viscous substance is made to bulge out from the orifice and a high voltage pulse is applied to the electrode to pull out the viscous substance through the orifice and a portion of the viscous substance pulled out of the orifice is cut and is made to adhere to a medium.

22 Claims, 6 Drawing Sheets

VISCOUS SUBSTANCE DISCHARGING METHOD USING A VISCOUS SUBSTANCE DISPENSER AND PATTERN FORMING METHOD USING A VISCOUS SUBSTANCE DISPENSER

TECHNICAL FIELD

The present invention relates to a viscous substance discharging method using a viscous substance dispenser to make a viscous substance adhere to or to apply the viscous substance to a medium, and a pattern forming method using the viscous substance dispenser.

BACKGROUND ART

A generally known dispenser having a container containing a liquid applies pressure to the liquid from behind to force the liquid out of the container and forms a pattern on a medium. The known dispenser is able to discharge a substance having a high viscosity and a substance having a low viscosity and to form patterns on a medium. However, in the known dispenser, it takes a long time for pressure to be propagated and hence the response of a liquid discharge operation to the pressure is not quick enough. Since the size of lines and dots is dependent on the outside diameter of a nozzle, the known dispenser is not suitable for minute patterning.

Another known method applies pressure to a liquid from behind the liquid and vibrates a portion of a dispenser around an outlet to form a liquid drop and attaches the liquid ball to a medium. This method, however, is unable to discharge highly viscous substance.

A pattern forming method that forms a pattern on a medium by discharging an ink from an orifice is known as an ink-jet patterning technique. The ink-jet patterning technique is exercised by a method that produces a bubble by heating a portion of a nozzle to force the ink out of the nozzle by the bubble, and a method that vibrates a piezoelectric ceramic element to force an ink out of a nozzle by a pressure generated by the vibration of the piezoelectric ceramic element. Each of these methods uses a very low force for forcing the ink out of the nozzle and is unable to discharge a highly viscous substance. The size of ink drops discharged from the orifice by the ink-jet patterning method is several times the diameter of the orifice.

Figure 9:
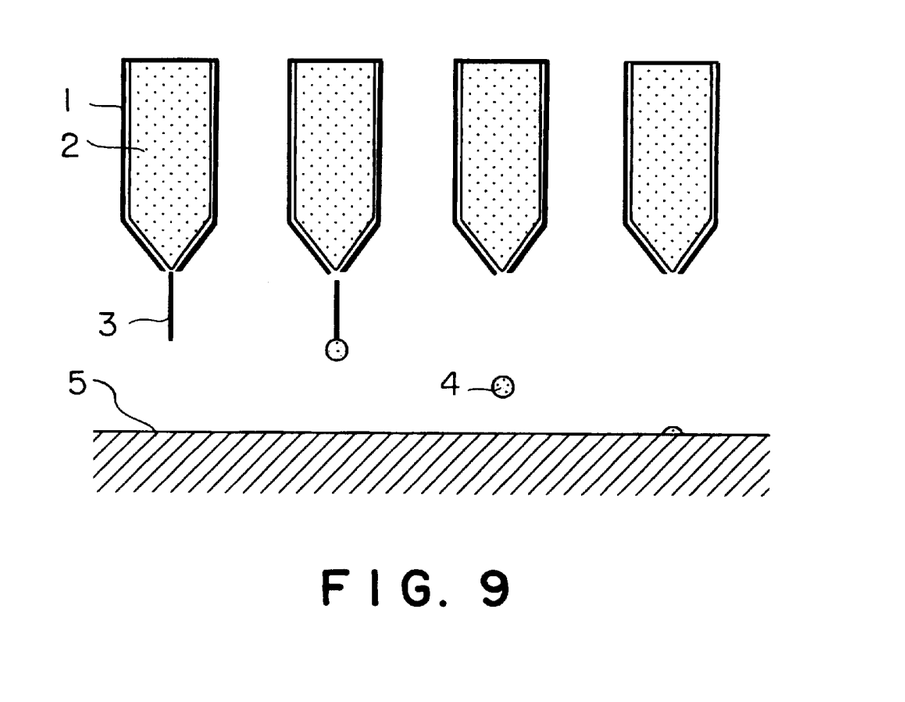
FIG. 9 is a typical view of assistance in explaining a conventional fluorescent screen forming method.

This problem will be explained with reference to FIG. 9. Referring to FIG. 9, a highly viscous substance 2 is extruded through an opening formed in the tip of a nozzle 1 by electrostatic attraction or electromechanical pressure. A string 3 of the extruded highly viscous substance 2 of a predetermined length is cut off the tip of the nozzle 1. Then, the string 3 of the extruded highly viscous substance 2 becomes a spherical drop 4 by its own surface tension, and the spherical drop 4 adheres to a medium 5 in a dot. Therefore, the dot inevitably has a size as large as five to six times the diameter of the orifice of the nozzle 1.

The diameter of the orifice must be reduced to form a smaller drop. When it is required to discharge an ink containing large particles, the orifice of a small diameter is clogged, offset is abraded by the particles and the life of the discharge device is shortened.

An ink-jet device of an electrostatic attraction type also is unable to discharge a highly viscous substance.

DISCLOSURE OF THE INVENTION

The present invention has been made to solve such problems and it is therefore an object of the present invention to provide a viscous substance discharging method using a viscous substance dispenser, capable of discharging the viscous substance even if the viscous substance contains particles of large particle sizes to make the viscous substance adhere to or to apply the viscous substance in minute patterns, and to provide a method of forming a pattern by the method of discharging a viscous substance.

According to the present invention, a viscous substance discharging method using a viscous substance dispenser comprises the steps of arranging an electrode in a portion or an entire portion of a container of the viscous substance dispenser having a circular orifice or a polygonal orifice of a diameter in the range of 50 $\mu$m to 1 mm in it lower portion and containing a viscous substance having a viscosity in the range of 1,000 to 1,000,000 cps, and making a meniscus of the viscous substance bulge out from the orifice, applying a voltage to the electrode to pull out the viscous substance through the orifice and cutting off a portion of the viscous substance pulled out of the orifice and making the cut portion of the viscous substance adhere to a medium.

The present invention is the method of discharging a viscous substance by a viscous substance dispenser wherein in the step of applying the voltage to the electrode with the meniscus of the viscous substance bulging out from the orifice, and cutting a portion of the viscous substance pulled out of the orifice to make the same adhere to the medium, the positional relation with respect to a horizontal direction between the medium and the orifice is changed according to the voltage.

In the method of discharging a viscous substance by a viscous substance dispenser according to the present invention, the absolute value of the voltage is in the range of 100 to 20,000 V.

In the viscous substance discharging method according to the present invention, the voltage is a pulse voltage.

In the viscous substance discharging method according to the present invention, the portion of the viscous substance is cut by reducing the absolute value of the voltage or by stopping the application of the voltage to the electrode.

The viscous substance discharging method using a viscous substance dispenser according to the present invention forms the meniscus by applying a pressure to the container containing the viscous substance.

In the viscous substance discharging method using a viscous substance dispenser according to the present invention, the distance between the orifice and the medium is in the range of 0.1 to 10 mm.

In the viscous substance discharging method using a viscous substance dispenser according to the present invention, the viscous substance contains particles having a particle size not greater than $\frac{1}{10}$ of the diameter of the orifice.

In the viscous substance discharging method using a viscous substance dispenser according to the present invention, the viscous substance contains particles of a mean particle size in the range of 0.1 to 10 $\mu$m.

In the viscous substance discharging method using a viscous substance dispenser according to the present invention, the container containing the viscous substance serves also as an electrode, and the voltage is applied to the container.

The viscous substance discharging method using a viscous substance dispenser according to the present invention forms the meniscus by heating the container containing the viscous substance.

In the viscous substance discharging method using a viscous substance dispenser according to the present invention, the voltage is a dc voltage.

In the viscous substance discharging method using a viscous substance dispenser according to the present invention, the voltage is a dc voltage, the voltage is applied to and removed from the electrode, and the pressure is controlled to form lines of the viscous substance in a line width not grater than ½ of the diameter of the orifice or dots of the viscous substance in a diameter not greater than ½ of the diameter of the orifice.

In the viscous substance discharging method using a viscous substance dispenser according to the present invention, the voltage is an ac voltage.

In the viscous substance discharging method using a viscous substance dispenser according to the present invention, the voltage is an ac voltage, the amplitude of the voltage and the pressure are controlled to form lines of the viscous substance in a line width not greater than ½ of the diameter of the orifice or to form dots of the viscous substance in a diameter not greater than ½ of the diameter of the orifice.

In the viscous substance discharging method using a viscous substance dispenser according to the present invention, the ac voltage has a frequency in the range of 1 Hz to 100 kHz.

According to the present invention, a pattern forming method using a viscous substance dispenser comprises the steps of arranging an electrode in a portion or a entire portion of a container of the viscous substance dispenser having a circular orifice or a polygonal orifice of a diameter in the range of 50 $\mu$m to 1 mm in it lower portion and containing a viscous substance having a viscosity in the range of 1,000 to 1,000,000 cps, and making a meniscus of the viscous substance bulge out from the orifice, applying a voltage to the electrode to pull out a portion of the viscous substance through the orifice and cutting off a portion of the viscous substance pulled out of the orifice and making the cut portion of the viscous substance adhere to a medium.

In the pattern forming method using a viscous substance dispenser according to the present invention, the viscous substance is a fluorescent substance, and the viscous substance discharging method is used for fabricating plasma display panels, electroluminescence display panels, field emission display panels or CRTs.

In the pattern forming method according to the present invention, the viscous substance contains at least glass powder, and is used for forming ribs.

According to the present invention, the formation of the ribs are used for fabricating plasma displays, electroluminescence displays or field emission displays.

In the pattern forming method according to the present invention, the viscous substance contains at least a binder resin, and is used for fabricating a spacer for defining a liquid crystal containing space in a liquid crystal display.

In the pattern forming method according to the present invention, the viscous substance contains at least a conductive substance, and is used for forming an electrode pattern.

BEST MODE FOR CARRYING OUT THE INVENTION

Preferred embodiments of the present invention will be described hereinafter.

Figure 1:
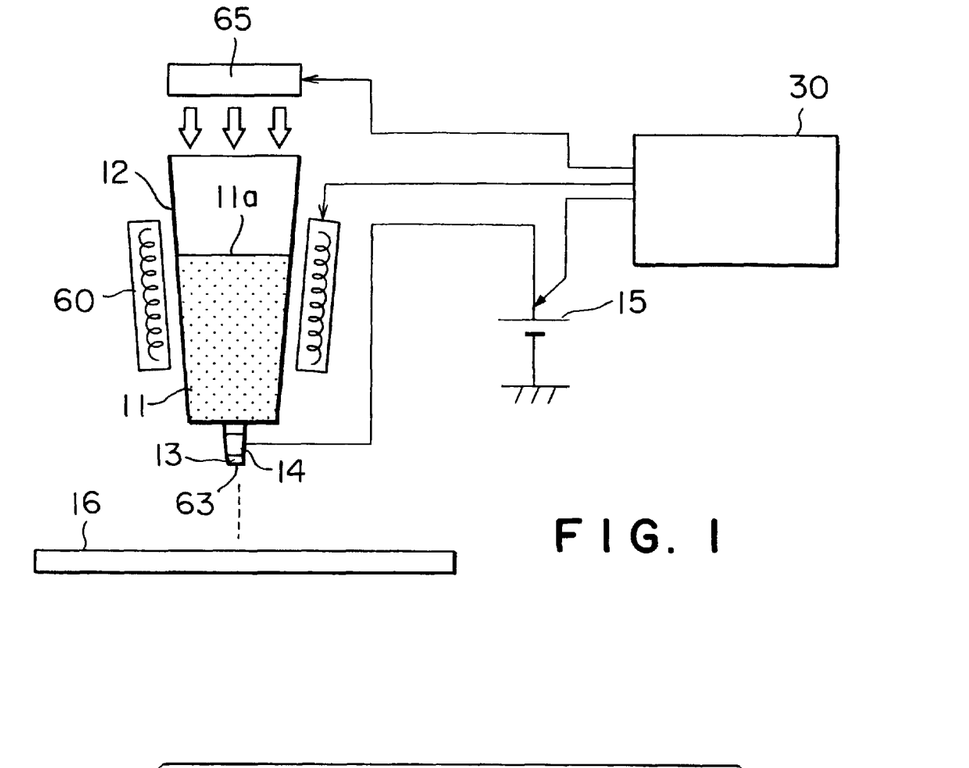
FIG. 1 is a diagrammatic view of a viscous substance dispenser employed in carrying out the present invention.

FIG. 1 is a diagrammatic view of a viscous substance dispenser according to the present invention.

Referring to FIG. 1, the viscous substance dispenser has a viscous substance container (syringe) 12, and an electrode 14 attached to the syringe 12. The viscous substance dispenser is disposed above a medium 16.

The syringe 12 contains a viscous substance containing particles of a fluorescent substance or the like dispersed therein, such as a viscous ink 11. The syringe 12 is provided at its lower end portion with an insulating nozzle 13 of Teflon or polypropylene having an inside diameter in the range of 50 $\mu$m to 1 mm. An orifice 63 is formed in an end portion of the nozzle 13. The inside diameter of the orifice 63 is determined selectively according to conditions including the viscosity of the substance, discharge rate and particle size.

The electrode 14 is formed on the outer surface of the nozzle 13. A pulse voltage in the range of 1 to 10 kV can be applied to the electrode 14 by a power supply 15 controlled by a controller 30. Although the insulating nozzle 13 is employed, the electrode 14 need not necessarily be formed on the nozzle 13. The electrode 14 may be formed at any position on the syringe 12 below the level of the ink surface 11a. The nozzle 13 need not necessarily be insulating, but may be formed of a metal, and both the syringe 12 and the nozzle 13 may be formed of a metal. If the nozzle 13 is formed of a metal or both the syringe 12 and the nozzle are formed of a metal, the any electrode need not be attached to the nozzle 13 and the nozzle 13 functions also as an electrode. The orifice 63 need not necessarily be formed in the end portion of the nozzle 13; the orifice 63 may be formed in the bottom wall of the syringe 12 or one or a plurality of holes formed in an ink container may be used instead of the orifice 63.

When necessary, a predetermined pressure may be applied to the ink 11 from above the syringe 12 by a pressing device 65 controlled by the controller 30. In accordance with the properties of the viscous substance to be discharged, the ink 11 may be heated at a temperature in the range of 50° to 150° C. by a heating device 60 surrounding the syringe 12 and controlled by the controller 30.

The medium 16 need not necessarily be a counter electrode and may be a paper sheet, a film or a glass sheet. The surface of the medium 16 need not necessarily be flat but may be curved or irregular. The distance between the orifice 63 and the medium 16 is in the range of about 0.1 to about 10 mm.

A viscous substance discharging method in accordance with the present invention using the viscous substance dispenser will be described with reference to FIGS. 2 to 4.

Figure 2:
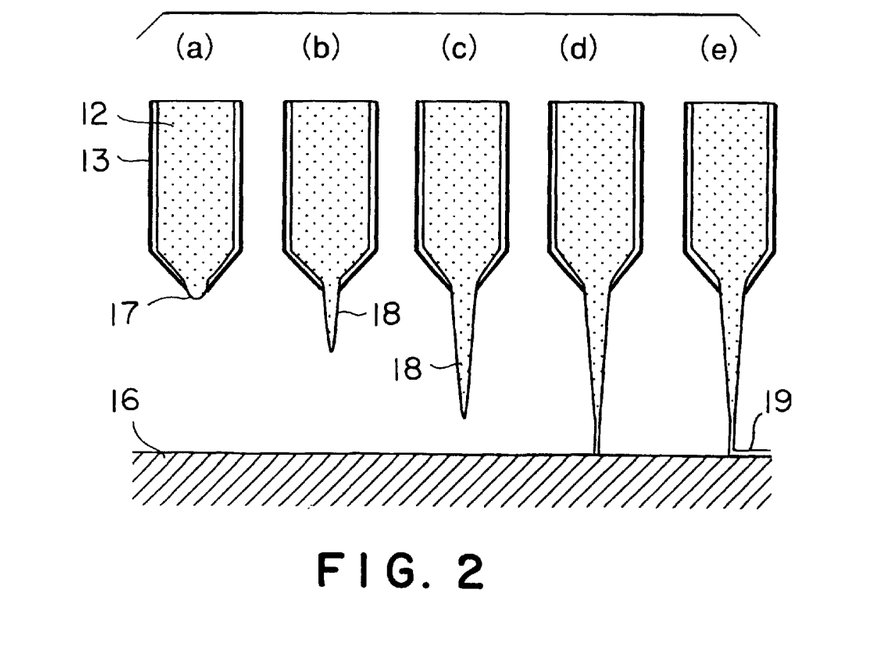
FIG. 2 is a typical view of assistance in explaining a viscous substance discharging process.
Figure 3:
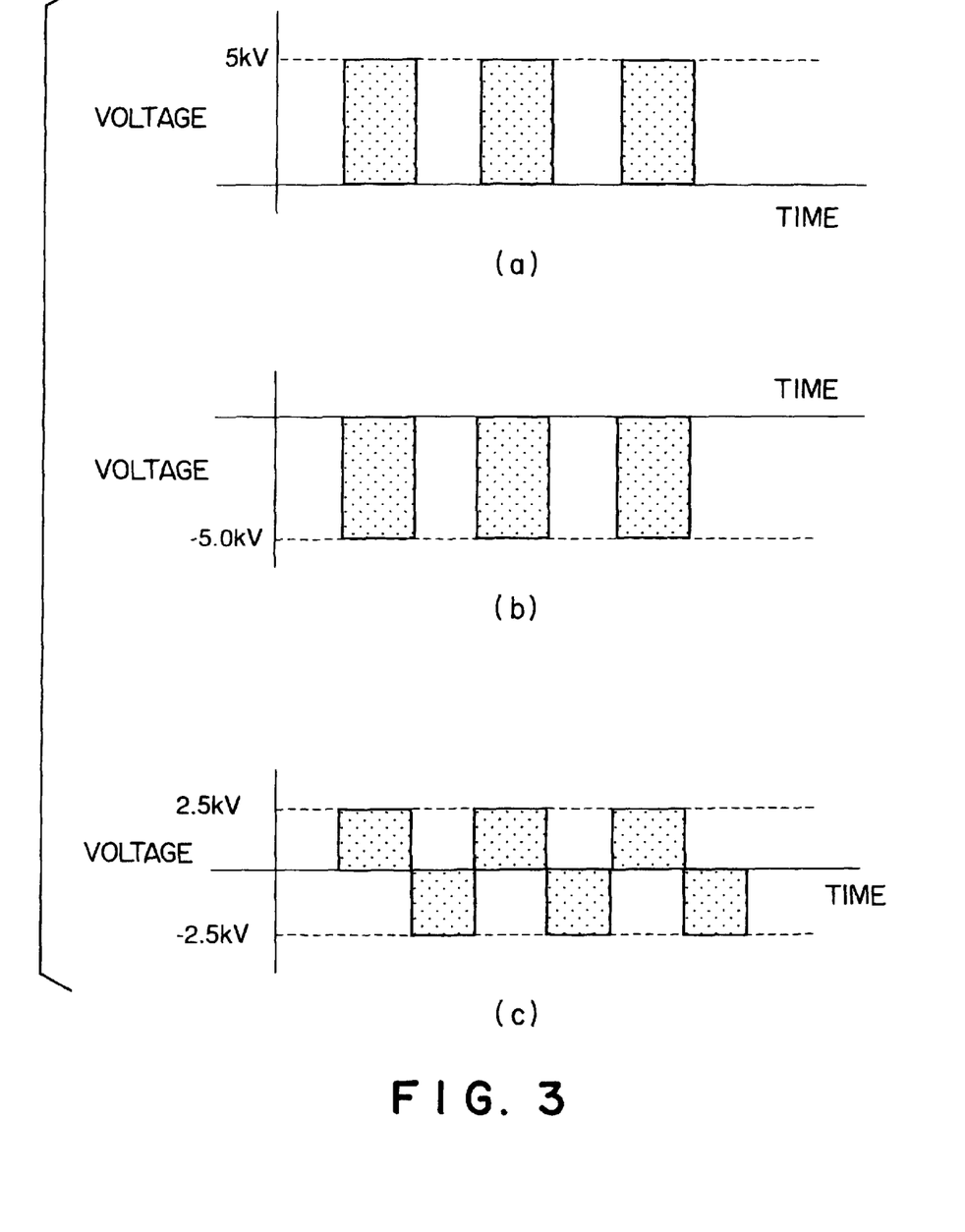
FIG. 3 is a diagram of assistance in explaining a pulse voltage.
Figure 4:
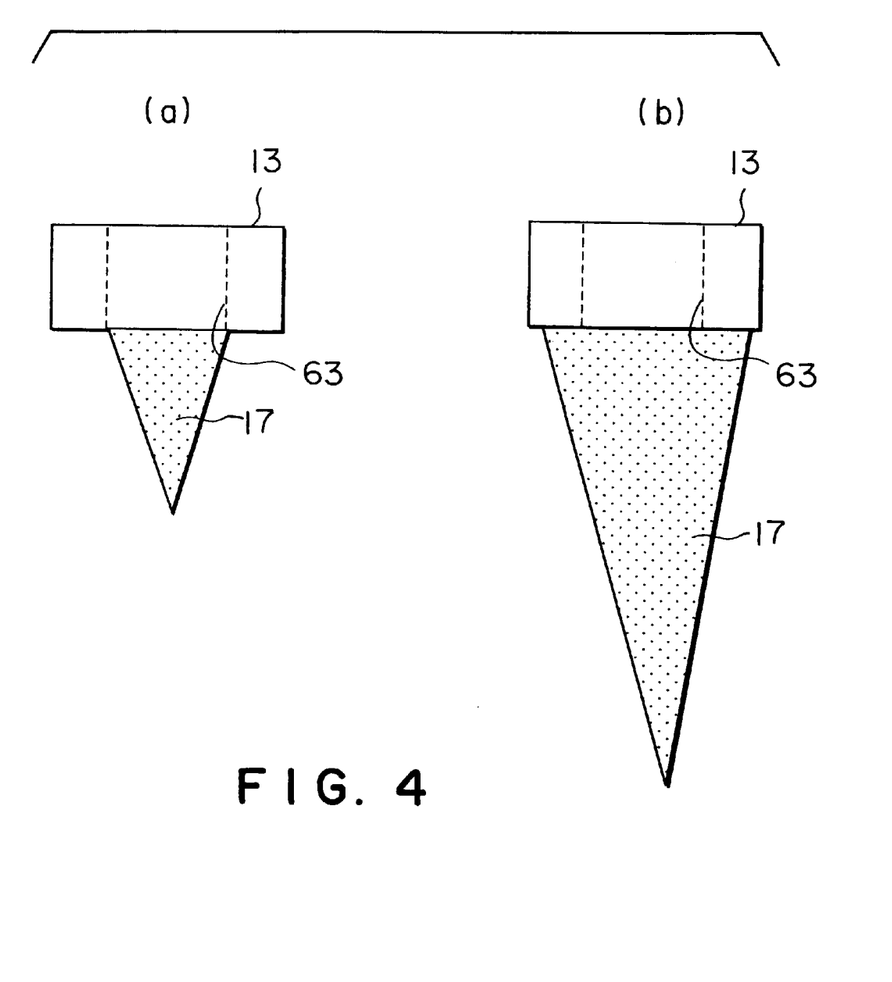
FIG. 4 is a typical view of assistance in explaining meniscuses.

FIG. 2 is a view of assistance in explaining a viscous substance discharging process, FIG. 3 shows a pulse voltage applied to the electrode 14 and FIG. 4 is a view of assistance in explaining meniscuses.

The viscous substance 11 contained in the syringe 12 is extruded gradually from the orifice 63 of the nozzle 13 by its own weight and forms a meniscus 17 in the orifice 63 as shown in FIG. 2(a). In this state, gravity and surface tension act on the meniscus 17. If the formation of the meniscus 17 by the agency of the weight of the viscous substance 11 takes much time or the meniscus 17 cannot be formed at all due to the diameter of the orifice 63 and the properties of the viscous substance 11, a pressure is applied to the ink 11 by the pressing device 65 to form the meniscus 17 forcibly. When necessary, the viscous substance 11 is heated by the heating device 60 to promote the formation of the meniscus 17.

Then, a dc or ac voltage is applied to the electrode 14 to produce potential differences between the surface of the meniscus 17 and the environment and between the tip and the interior of the meniscus 17. Consequently, a electrostatic pressure is generated to strain the meniscus 17 in a conical shape as shown in FIG. 2(b). When the voltage is not lower than a threshold voltage, the conical meniscus extends toward the medium 16 to form an elongate conical portion 18 as shown in FIG. 2(c). Eventually, the tip of the elongate conical portion 18 reaches the surface of the medium 16 as shown in FIG. 2(d). If the medium 16 and the nozzle 13 are moved horizontally relative to each other, a fine line 19 of the viscous substance is formed as shown in FIG. 2(e) as the medium 16 and the nozzle 13 are moved horizontally relative to each other.

The viscous substance is discharged continuously. The discharge of the viscous substance can be stopped by reducing the voltage to a value below the threshold voltage or by removing the voltage from the electrode 14. In some cases where the viscous substance is discharged at a high discharge rate under pressure, it is impossible to stop discharging the viscous substance only through the control of the voltage. In such a case, the pressure applied to the viscous substance must be removed simultaneously with the control of the voltage.

The threshold voltage is the lowest voltage necessary for the stable discharge of the viscous substance. The viscous substance is discharged when the effective value of the ac voltage or the absolute value of the dc voltage exceeds the threshold voltage. The same threshold voltage does not apply to all systems and is dependent on the properties of the viscous substance, the size of the nozzle, the type of the medium and the nozzle-medium distance and the like.

Preferably, the voltage to be applied to the electrode 14 is in the range of 100 V to 20 kV. In view of voltage control and the discharge of the viscous substance, it is more preferable that the voltage is in the range of 1 to 7 kV. When a dc voltage is used, the dc voltage may be such as has an absolute value in the range of 100 V to 20 kV. The polarity of the dc voltage does not affect the discharge of the viscous substance. When an ac voltage is used, the ac voltage may be such as has an effective value in the range of 100 V to 20 kV. Preferably, the ac voltage has a rectangular waveform as shown in FIG. 3. If the amplitude is 5 kV as shown in FIGS. 3(a) to 3(c), viscous substance discharging modes using a voltage varying between 0 and 5 kV, between 0 and −5 kV and between −2.5 and 2.5 kV are substantially the same. The frequency of the voltage for discharging the viscous substance is in the range of 1 Hz to 1,000 kHz. An optimum frequency is dependent principally on the electric conductivity of the viscous substance. The optimum frequency has a tendency to increase as the electric conductivity increases.

The shape of the elongate conical meniscus 17 is dependent on the amplitude of the pulse voltage and the rheological properties of the viscous substance. For example, the meniscus 17 tapers sharply from the end of the orifice 13 formed in an end portion of the nozzle 13 as shown in FIG. 4(a) when the pulse voltage has a great amplitude, and tapers gradually from the orifice 63 as shown in FIG. 4(b) when the pulse voltage has a small amplitude.

When the nozzle 13 of the viscous substance dispenser is thin as shown in FIG. 1, the diameter of a portion of the meniscus 17 corresponding to the orifice 63 is equal to the inside diameter of the nozzle 13, i.e., the diameter of the orifice 63, as shown in FIG. 4(a) if a high pulse voltage (voltage having a great amplitude) is used, and is equal to the outside diameter of the nozzle 13 as shown in FIG. 4(b) if the pulse voltage has a small amplitude.

If the amplitude of the pulse voltage is excessively great, the meniscus 17 tapers off before the tip of the meniscus 17 reaches the medium 16 and, if the medium 16 is flat, the viscous substance adheres to a portion in a certain range around a center on the medium 16. The greater the distance between the tip of the meniscus 17 and the medium 16, the wider the range in which particles of the viscous substance adhere to the medium.

Accordingly, when forming a small dot of the viscous substance 11 on the medium 16 or when forming a fine line of the viscous substance 11 on the medium 16 by moving the orifice 63 relative to the medium 16, it is suitable to reduce the distance between the tip of the meniscus 17 and the medium 16 by (1) using a pulse voltage having a small amplitude or (2) reducing the distance between the orifice 63 and the medium 16. A portion of the viscous substance 11 adheres to the medium 16 when the meniscus 17 comes into contact with the medium 16 before the same tapers off completely. Therefore, a line of the viscous substance can be formed and the width of the line can be controlled by varying the amplitude of the voltage pulse, if a dc voltage is used, and the pressure or by controlling a voltage applying operation, if a dc voltage is used, and the pressure. The width of the line of the viscous substance 11 or the diameter of the dot of the viscous substance 11 is not greater than ½ of the diameter of the orifice.

The present invention is applicable to discharging substances having viscosities in a wide viscosity range from a low viscosity to a very high viscosity. Substances having viscosities not higher than 1,000 cps are undesirable because those substances are unable to remain in a desired shape on the medium. Substances having viscosities exceeding 1,000,000 cps are undesirable because it is difficult to fill those substances in a discharge unit. Thus, viscous substances having viscosities in the range of 1,000 to 1,000 cps are preferable. The viscous substance 11 may contain particles of particle sizes not greater than ¹⁄₁₀ of the diameter of the orifice 63. Particles having mean particle sizes in the range of 0.1 to 10 μm are preferable.

The absolute value of the voltage applied to the electrode 14 may be in the range of 100 to 20,000 V.

The viscous substance 11 may be, for example, any one of instantaneous adhesives, paints, inks, high-viscosity one-component epoxy resins, two-component RTV rubbers, silver pastes, solder pastes, industrial greases and fluorescent substances. The present invention is applicable to the formation of a spacer using a resin containing glass beads.

Uses

This viscous substance discharging method using the viscous substance dispenser can be used for forming patterns in the following fields.

(1) Displays: Fluorescent devices for PDPs, ribs, electrodes, fluorescent devices for CRTs, fluorescent devices for FEDs, color filters (RGB layers, black matrices) for liquid LCDs, spacers, microlenses and the like (2) Storage devices, semiconductor devices, magnetic materials, ferroelectric materials, conductive pastes (wiring lines, antennas) and the like (3) Graphic uses: Ordinary printing, printing on special mediums (films, fabrics, steel sheets and such), curved surface printing, machine plates for printing and the like (4) Process materials: Adhesives, sealing materials and the like (5) Biotechnological and medical purposes: Medicines (mixtures of small amounts of a plurality of components), gene diagnosis and the like Viscous Substances The viscous substance 11 will be described.

The viscous substance 11 is not limited to a single-phase liquid but may be a liquid of a plurality of phases called a suspension, a disperse system or an emulsion.

The viscosity of the liquid is in the range of 1,000 to 1,000,000 cps. A string of a low-viscosity liquid having a viscosity not higher than 1,000 formed on a medium levels out quickly before drying and forms a thick line on the medium and hence fine patterns cannot be formed by such a low-viscosity liquid. Therefore, it is preferable that the liquid to be applied to an ordinary medium has a viscosity in the range of 1,000 to 1,000,000 cps.

Preferably, the liquid has an electric conductivity in the range of $10^{-10}$ to $10^{-4}$ $\Omega^{-1} \cdot cm^{-1}$.

The effect of electric conductivity on discharging mode will be explained.

(1) If the liquid has an electric conductivity below the lower limit of the foregoing range, the potential on the surface of the liquid is low and hence the effect of voltage application (tapering and attraction toward the medium) is low, pulsation is enhanced to make discharge rate unstable, large liquid drops are discharged intermittently and arriving positions of liquid drops on the medium are unstable.

(2) If the liquid has an electric conductivity beyond the upper limit of the foregoing range, the potential on the surface of the liquid is high and hence discharges are liable to occur across air between the liquid, and parts around the liquid and the surface of the medium.

The electric conductivity and the optimum frequency of the voltage are interdependent. For example, although dependent on composition, an optimum frequency for a fluorescent paste of $10^{-9}$ $\Omega^{-1} \cdot cm^{-1}$ in electric conductivity is 50 Hz and an optimum frequency for a fluorescent paste of $10^{-7}$ $\Omega^{-1} \cdot cm^{-1}$ in electric conductivity.

Viscous substances preferably employed in the present invention have electric conductivities in the range of $10^{-10}$ to $10^{-4}$ $\Omega^{-1} \cdot cm^{-1}$. The viscous substance must be a liquid (fluidic) at an operating temperature. Therefore, the viscous substance contains an organic or inorganic liquid as a principal component, and a pattern forming material (objective substance) dissolved or dispersed in the organic or inorganic liquid. Generally, the viscous substance is a mixture of a liquid, a binder and a objective substance and may contain desired additives, such as a dispersing agent, defoaming agent, a thixotropic agent and/or the like, provided that the electric conductivity lie in the foregoing range.

In most cases, the electric conductivity of the viscous substance is dependent on the composition of the organic or inorganic liquid. Although dependent on composition, the electric conductivity of an ink designed and prepared by using a liquid having a desired electric conductivity as a principal component is approximately equal to that of the liquid.

Inorganic liquid which can be used in the present invention having an electric conductivity in the range of $10^{-10}$ to $10^{-4}$ to $10^{-1} \cdot cm^{-1}$ are, for example, water, $COCl_2$, HBr, $HNO_3$, $H_3PO_4$, $H_2SO_4$, $SOCl_2$ and $FSO_3H$.

Possible organic liquids are alcohols including methanol, n-propanol, isopropanol, n-butanol, 2-methyl-1-propanol, tertiary butanol, 4-methyl-2-pentanol, benzyl alcohol, α-terpineol, ethylene glycol, glycerin, diethylene glycol and triethylene glycol; phenols including phenol, o-cresol, m-cresol and p-cresol; cyclic ethers including dioxane, furfural, ethylene glycol dimethyl ether, methyl cellosolve, ethyl cellosolve, ethyl carpitol, butyl carpitol, butyl carpitol acetate and epichlorohydrin; ketones including aceton, methyl ketone, 2-methyul-4-pentanon and acetophenone; fatty acids including formic acid, acetic acid, dichloroacetic acid and trichloroacetic acid; esters including methyl formate, ethyl formate, ethyl acetate, n-butyl acetate, isobutyl acetate, 3-methoxybutyl acetate, n-pentyl acetate, ethyl propionic acid, ethyl lactate, methyl benzoate, diethyl malonate, dimethyl phthalate, diethyl carbonate, ethylene carbonate, propylene carbonate, cellosolve acetate, butyl Carbitol acetate, ethyl acetoacetate and ethyl cyanoacetate; nitrogeneous compounds including nitromethane, nitrobenzene, acetonitrile, propionitrile, succinonitrile, valeronitrile, benzonitrile, ethylamine, diethylamine, ethylenediamine, aniline, N-methylaniline, N,N-dimethylaniline, o-toluidine, p-toluidine, piperidine, pyridine, α-picoline, 2,6-lutidine, quinoline, propylenediamine, formamide, N-methylformamide, N,N-dimethylformamide, N,N-diethylformamide, acetoamide, N-methylacetoamide, N-methylpropionamide, N,N,N',N'-tetramethylurine and N-methylpyrrolidone; sulfuric compounds including dimethyl sulfoxide and sulfolane; hydrocarbons including benzene, p-cymene, naphthalene, cyclohexylbenzene and cyclohexene; and halogenated hydrocarbons including 1,1-dichloroethane, 1,2-dichloroethane, 1,1,1-trichloroethane, 1,1,1,2-tetrachloroethane, 1,1,2,2-tetrachloroethane, pentachloroethane, 1,2-dichloroethylene(cis-), tetrachloroethylene, 2-chlorobutane, 1-chloro-2-methylpropane, 2-chloro-2-methylpropane, bromomethane, tribromomethane and 1-bromopropane.

The electric conductivity of a viscous substance containing a substance having a high electric conductivity (such as silver powder) in a concentration greater than that of the liquid component, such as a conductive paste, cannot be adjusted by the composition of the liquid. In such a case, ink composition must be designed on the basis of the correlation between solid concentration and electric conductivity determined beforehand through preliminary measurement.

Substances which are a solid at room temperatures among the foregoing substances ,are heated at a temperatures not lower than their melting points when supplying the same to the nozzle. Such a method is used generally by the hot-metal ink-jet recording system. However, a recording unit that uses such a substance must be provided with a heating device and needs a long warm-up time. Therefore such substances which are solid at room temperatures are used only for special purposes that require quick drying.

The boiling point of the liquid is an important factor that affects the degree of clogging of the orifice. Preferably, the boiling point is in the range of 150° to 300° C., more preferably, in the range of 180° to 250° C. A liquid having a boiling point below 150° C. is liable to dry and cause clogging. A liquid having a boiling point above 300° C. takes much time for drying after recording and is not desirable. Preferably, the discharged substance contains such a liquid having a high boiling point in 50% by weight or above, more preferably, 70% by weight or above.

There is no particular restriction on a objective substance to be dissolved or dispersed in the liquid, except that coarse particles that will clog the nozzle must be excluded. Generally known fluorescent substances can be used without difficulty for forming PDPs, CRTs and FEDs. For example, red fluorescent substances including $(Y,Gb)BO_3$:Eu and $YO_5$:Eu, green fluorescent substances including $Zn_2SiO_4$:Mn, $BaAl_{12}O_{19}$:Mn, and $(Ba, Sr, Mg)O.\alpha$-$Al_2O_3$:Mn, and blue fluorescent substances including $BaMgAl_{14}O_{23}$:Eu and $BaMgAl_{10}O_{17}$:Eu are possible fluorescent substances.

Preferably, the viscous substance contains a binder for firmly bonding the objective substance to the recording medium. Possible binders are, for example, cellulose and its derivatives including ethyl cellulose, methyl cellulose, nitrocellulose, cellulose acetate and hydroxyethyl cellulose; alkyd resins; (metha)acrylic resins and their metallic salts including polymethacrylate, polymethyl methacrylate, 2-ethylhexyl methacrylate-methacrylate copolymers and lauryl methacrylate-2-hydroxyethyl methacrylate copolymers; poly(metha) acrylamide resins including poly(N-isopropyl acrylamide) and poly(N,N-dimethyl acrylamide); styrene resins including polystyrenes, acrylonitrile-styrene copolymers, styrene-maleic acid copolymers and styrene-isoprene copolymers; styrene-acrylate resins including styrene-n-butyl methacrylate copolymers; saturated and unsaturated polyester resins; polyolefin resins including polypropylenes; halogenated polymers including polyvinyl chlorides and polyvinylidene chlorides; vinyl resins including polyvinyl acetate and vinyl chloride-vinyl acetate copolymers; polycarbonate resins; epoxy resins; polyurethane resins; polyacetal resins including polyvinyl formals, polyvinyl butyrals and polyvinyl acetals; polyethylene resins including ethylene-vinyl acetate copolymers and ethylene-ethyl acrylate copolymers; amide resins including benzoguanamine resins; urea resins; melamine resins; polyvinyl alcohol resins and their anion cation modifications of the polyvinyl alcohol resins; polyvinyl pyrrolidons and their copolymers; alkylene oxide homopolymers, copolymers and crosslinked polymers; polyalkylene glycols including polyethylene glycol and polyproplylene glycol; polyether polyols; SBR and NBR latexes; dextrins; sodium alginate; natural and semisynthetic resins including gelatin, gelatin derivatives, casein, hibiscus manihot L, tragacanth gum, pullulan, gum arabic, locust beam gum, guar gum, pectin, carrageenin, glue, albumin, starch, corn starch, konnyaku, funori, agar and soybean protein; terpene resins; ketone resins; rosin and rosin ester; polyvinyl methyl ether; polyethylene imine; polystyrene sulfonic acid; and polyvinyl sulfonic acid. Those resins may be used in blends as well as in homopolymers.

Electrode

The electrode 14 will be explained

The electrode 14 may be realized in any one of the following forms.

(1) The nozzle 13 and the orifice 63 are formed of a material suitable for forming electrodes.
(2) The electrode is disposed on side walls defining the nozzle 13 and the orifice 63.
(3) The electrode is disposed inside the nozzle 13 and the orifice 63.
(4) The electrode is disposed outside the nozzle 13 and the orifice 63.
(5) The electrode is embedded in walls defining the nozzle 13 and the orifice 63.

Although the necessary voltage is related with the distance between the end of the orifice 63 and the electrode 14 in the forms stated in (2) to (5), the position of the electrode 14 may be at any position in a very wide range. The inventors of the present invention found that, although dependent on discharge velocity, the viscous substance can be discharged even if the electrode 14 is spaced more than 10 cm apart from the end of the orifice 63. In view of the magnitude of the necessary voltage, it is preferable that the distance between the end of the orifice 63 and the electrode 14 is not greater than 100 mm, more preferably, not greater than 30 mm. Such freedom of selection of the position of the electrode is a significant advantage in designing the discharge head.

When the recording medium is highly conductive or when a plurality of nozzles 13 are arranged in an array and different signals are given to the adjacent nozzles 13, it is desirable in view of preventing discharge or crosstalk, to space the electrode 14 not less than 0.5 mm, preferably, a distance in the range of 1 to 100 mm, more preferably, a distance in the range of 1 to 30 mm apart from the end of the orifice 63.

When the electrode 14 is disposed outside the nozzle or the slit, a desirable thickness of a nozzle wall or a slit wall is in the range of 1 to 1,000 $\mu$m.

Material for the Electrode

A metal or a metal oxide having an electric conductivity in the range of $1\times10^{-4}$ to $1\times10^{10}\Omega^{-1}\cdot cm^{-1}$ is a desirable material for the electrode 14. Possible metals are, for example, Au, Ag, Pt, Cu and alloys including stainless steels and brass. Possible metal oxides are, for example, conductive ceramic materials of ITO and tin oxide. When the electrode 14 is disposed in the passage, it is preferable to form the electrode 14 of a material highly resistant to chemical substances, for example, a noble metal, such as Au or Pt, or a conductive ceramic material. In some cases, a bar code is formed on the surface of the electrode 14 to prevent the quality alteration and abrasion of the electrode 14.

Application of the Voltage

The voltage to be applied to the electrode 14 will be described.

The voltage to be applied to the electrode 14 to discharge the viscous substance may be either a dc voltage or an ac voltage. An ac voltage is preferable in view of ensuring stable discharge of a viscous substance. A preferable range of the voltage $V_{p-p}$ is 100 V to 20 kV. It is more preferable that the voltage is in the range of 1 to 7 kV in view of ensuring the proper control of the voltage and stable discharge.

Preferably, the voltage has a rectangular waveform.

Although dependent on viscosity and composition, the optimum frequency of the voltage is dependent on the electric conductivity of the viscous substance. In most cases, the optimum frequency of the voltage increases with the increase of the electric conductivity. Low frequencies are undesirable because depositions are liable to form on the electrode when the frequency is low. The control of the power supply is difficult from the viewpoint of the ability of the power supply if the frequency is excessively high. A preferable frequency is in the range of 1 Hz to 10 kHz. From the viewpoint of continuity of discharge and voltage control, it is preferable that the frequency is in the range of 10 Hz to 4 kHz.

When a dc voltage is used, the voltage is in the range of 100 V to 20 kV regardless of polarity.

Medium 16

There is no particular restriction on the quality of the medium 16. The viscous substance can be discharged onto the surface of a liquid of 100 cps or above in viscosity or the surface of a solid. The discharge of the viscous substance onto the surface of a liquid having a low viscosity is difficult because it is possible that the liquid is attracted to the recording electrode.

The continuous discharge of the viscous substance onto a surface having irregularities of several hundreds micrometers or greater is not desirable because the discharge rate is unstable due to the variation of the gap.

The attraction of the viscous substance to the medium 16 is affected slightly by the electric conductivity of the surface of the medium 16, which, however, is not significant. However, if the medium 16 is made of a material having a high electric conductivity, such as a metal, the electrode must be spaced a sufficient distance apart from the surface of the medium 16 because it is possible that a discharge passes between the electrode and the medium 16 or an excessively high current flows through the discharged viscous substance.

Orifice 63

The orifice 63 may be defined by the following materials.

Conductive materials: Stainless steels, brasses, Al, Cu, Cr and the like

Insulating material(semiconductors): Ceramic materials including glass, mica, zirconium oxide, alumina and silicon nitride, and plastic materials including PEEK, Teflon and NC nylon Preferably, an end portion of a structure defining an end portion of the orifice 63 is coated with a material having a low surface free energy, such as Teflon, to prevent the wetting of the end portion of the structure with the viscous substance and the spread of the viscous substance. If the viscous substance spreads on the end portion of the structure, the meniscus cannot be formed in a stable shape in the orifice 63, the viscous substance remains in the end portion of the orifice after the discharge of the viscous substance has been stopped, and the remaining viscous substance affects adversely to the subsequent recording operation.

Shape of the Orifice

Nozzle: The nozzle hole may be either circular or polygonal. Preferably, the diameter of the nozzle hole is in the range of 50 to 2,000 $\mu$m.

Slit: Preferably, the width of the slit is in the range of 50 to 2,000 $\mu$m. From the viewpoint of forming a stable meniscus and preventing clogging, it is more preferable that the width of the slit is in the range of 100 to 1,000 $\mu$m.

Recording Gap

Preferably, the distance between the orifice 63 and the medium 16 is in the range of 0.1 to 10 mm, more preferably, in the range of 0.2 to 2 mm. A stable meniscus cannot be formed, a line of a fixed width cannot be formed because the viscous substance is unable to follow small irregularities in the recording medium and the line may possibly be broken when the distance is less than 0.1 mm. The linearity of discharge is deteriorated when the distance is greater than 10 mm.

EXAMPLES

Examples of the present invention will be described hereinafter.

Preparation of Fluorescent Paste

Fluorescent substance: Green P1-G1S (Kasei Oputonikusu) (Red: KX-504A, Blue: KX-501a), 65% by weight Acrylic resin: MP-4009 (Soken Kagaku), 100% by weight Solvent: Butylcarbitol acetate : butylcarbitol=1:1.25 percent by weight.

The fluorescent substance, the acrylic resin and the solvent were mixed and kneaded by a three-roll process to prepare a fluorescent paste (viscous substance) 11.

The measured viscosity of the fluorescent paste 11 was 70,000 cps.

Viscous Substance Dispenser

Figure 5:
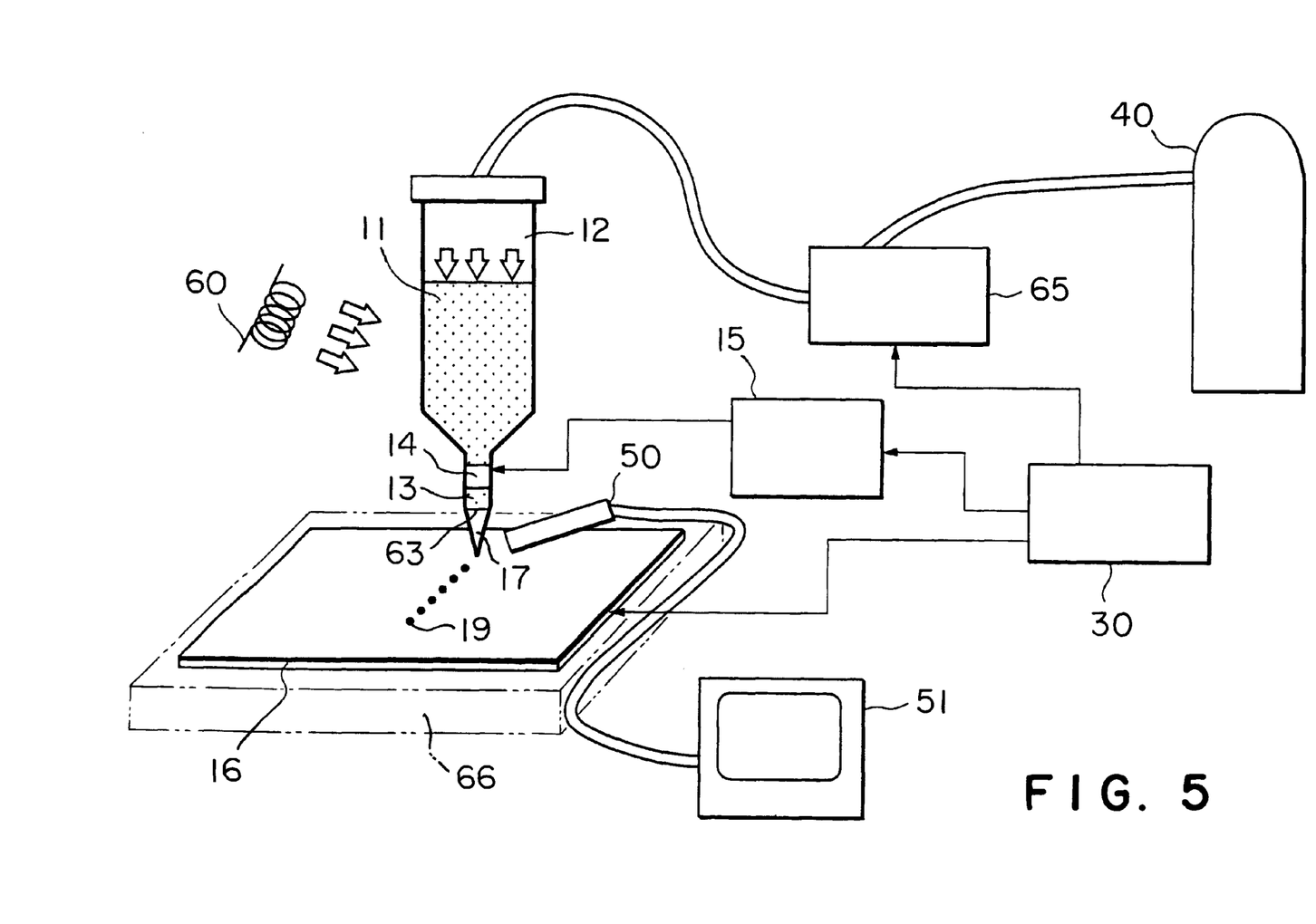
FIG. 5 is a block diagram of a viscous substance dispenser according to the present invention.

FIG. 5 is a block diagram of a viscous substance dispenser according to the present invention.

In this example, the viscous substance dispenser is supposed to have an insulating discharge part.

Referring to FIG. 5, the viscous substance dispenser has a syringe 12. The viscous substance 11 is filled in the syringe 12. The syringe 12 is provided in its lower portion with a discharge part (nozzle) 13 made of Teflon and having an inside diameter of about 270 $\mu$m. An electrode 14 is attached to a portion of the discharge part 13 near an outlet (orifice) 63. A high voltage is applied to the electrode 14. A medium 16 is supported on an XY stage 66 capable of moving in horizontal directions. The horizontal position of the medium 16 relative to the orifice 63 of the discharge part 13 can optionally be varied. The pressure in the syringe 12 can optionally be adjusted by a pressure controller (pressing device) 65 connected to a nitrogen gas cylinder 40. When necessary, the temperature of the syringe 12 and the viscous substance 11 contained in the syringe 12 can be controlled by a heating device 60. A controller 30 controls all those components. The controller 30 controls a power supply 15, the pressure controller 65, the XY stage 66, the pressure in the syringe 12, the amplitude and timing of application of voltage pulses generated by a power supply 15, positions at which the viscous substance 11 is discharged, the discharge rate of the viscous substance 11 to discharge the viscous substance 11 contained in the syringe 12 in a pattern onto the medium 16. The viscous substance discharge operation is taken by a CCD camera 50 and is displayed on a monitor 51 for observation.

Results of the viscous substance discharge operation for discharging the viscous substance 11 carried out by the viscous substance dispenser shown in FIG. 5 will be described.

Discharging Conditions

Material of the discharge part 12: Teflon

Diameter of the orifice 63 of the discharge part 13: 270 $\mu$m

Base material (medium) 16: Glass

Distance between the orifice 63 and the base material 16: 0.75 mm

Pressure: 3 atm

Temperature: Room temperature (25° C.)

Voltage (amplitude): 2 to 15 kV

Offset: −2.6 to 2.5 kV (Amplitude: 5 kV)

Frequency: 10 Hz to 1 kHz

Waveform: Rectangular

Figure 6:
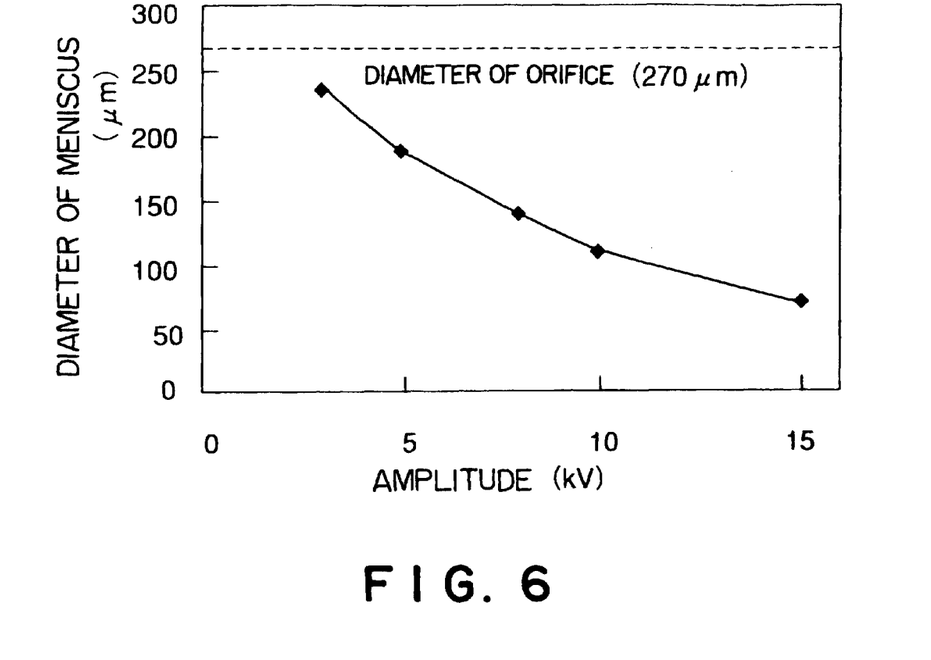
FIG. 6 is a graph showing the relation between the amplitude of a pulse voltage and the diameter of a meniscus.

During the viscous substance discharge operation under those conditions, the amplitude of the voltage pulse was varied in the range of 2 to 15 kV (offset: 0 V, frequency: 1 kHz) and an image of a meniscus 17 was taken by the CCD camera 50 and the shape of the meniscus 17 was observed. The meniscus 17 was stretched in a conical shape and the viscous substance 11 was discharged when the amplitude was 3 kV or above. The diameter of a portion of the meniscus 17 at a position 0.25 mm apart from the orifice 63 was measured. As shown in FIG. 6, there is a tendency for the diameter of the portion of the meniscus 17, at a distance equal to ⅓ of the length of the meniscus 17 from the base material of the meniscus 17, to decrease as the amplitude of the voltage pulse increases. The length of the orifice 17 was shorter than the distance between the orifice and the base material and the paste was broken and discharged in droplets when the amplitude was 10 kV or above.

The shape of the meniscus was observed by forming an image of the meniscus by the CCD camera with the amplitude fixed at 5 kv, the frequency fixed at 1 kHz and the offset varied in the range of −2.5 to 2.5 kV. The shape of the meniscus and discharging condition did not vary.

Figure 7:
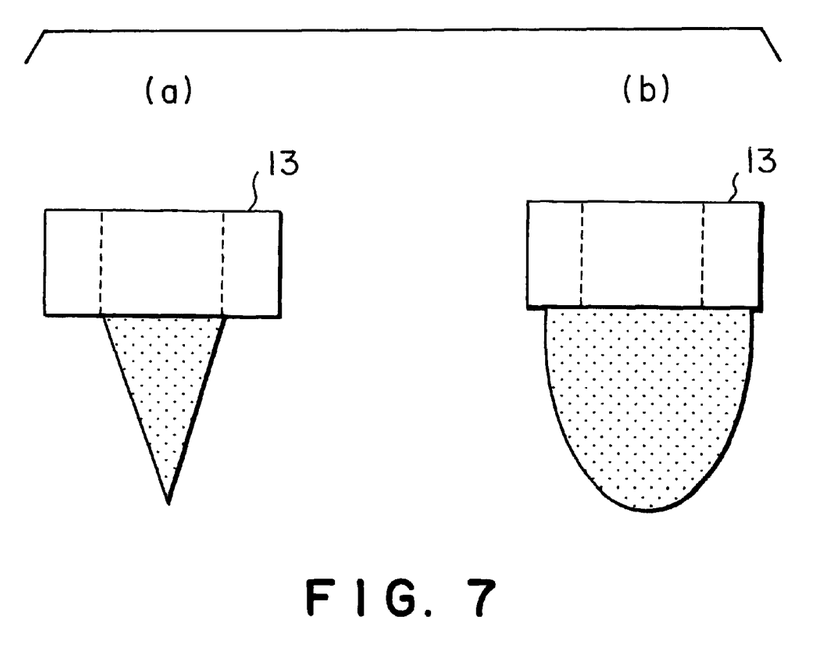
FIG. 7 is a typical view of meniscuses.

Similarly, discharging condition was observed with the amplitude fixed at 5 kV, the offset fixed at 0 V and the frequency varied in the range of 10 Hz to 1 kHz. When the frequency was as high as 1 kHz, a meniscus 17 of a shape as shown in FIG. 7(a) was formed upon the application of the voltage to the electrode and the viscous substance 11 was discharged. When the frequency was lowered, the speed of response of the formation of the meniscus to the application of the voltage lowered as the frequency was lowered and a bulged meniscus as shown in FIG. 7(b) was formed and the discharge of the viscous substance became unstable.

Figure 8:
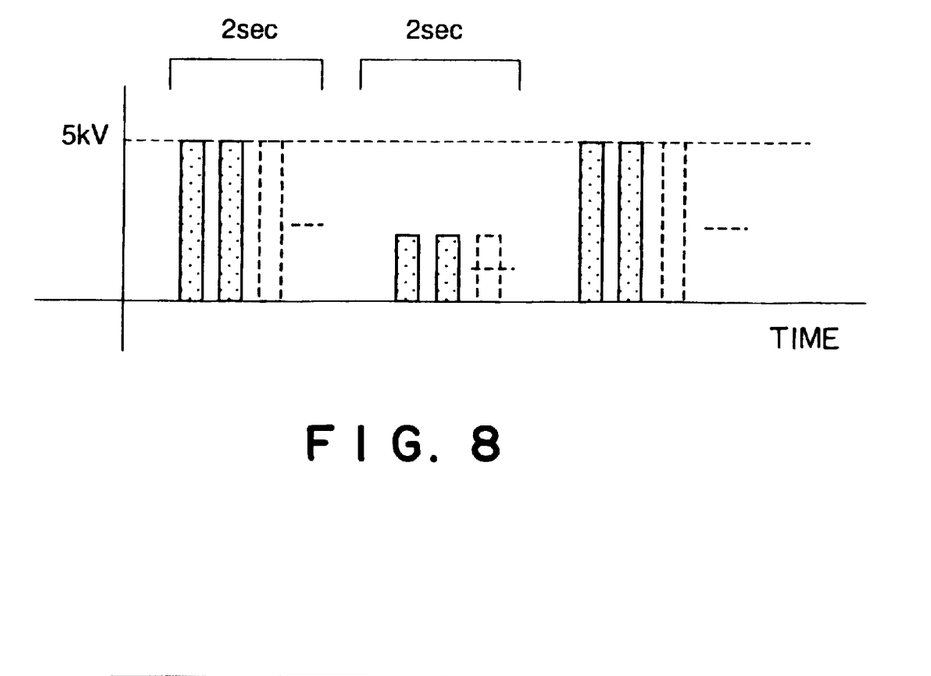
FIG. 8 is a diagram of a pulse voltage.

Viscous substance discharging condition was observed while voltages of 2 kV and 5 kV in amplitude were applied alternately to the electrode with the frequency fixed at 1 kHz and the offset fixed at 0 V. Duration of each of 2 kV and 5 kV was 2 s as shown in FIG. 8. The paste was discharged when the voltage was 5 kV, the paste was not discharged when the voltage was 2 kV, the shape of the meniscus when the voltage was 2 kV was the same as that of the meniscus when the voltage was 5 kV.

A line of the fluorescent paste could be formed in a width of 40 μm under the foregoing discharging conditions, except that the amplitude was 5 kV (offset voltage=0), and the frequency was 1 kHz by moving the viscous substance dispenser at a moving speed of 50 mm/s relative to the base material.

As is apparent from the foregoing description, according to the present invention, a viscous substance having a viscosity in the range of 1,000 to 1,000,000 cps and a viscous substance containing particles having a large particle size can be applied to a medium in dots having a very small diameter and lines having a very small width. Thus, the viscous material can be applied to a medium in a very fine pattern.

What is claimed is:

1. A viscous substance discharging method using a viscous substance dispenser comprising the steps of:
    arranging an electrode in a portion or an entire portion of a container of the viscous substance dispenser having a circular orifice or a polygonal orifice of a diameter in the range of 50 μm to 1 mm at a lower portion of the container and containing a viscous substance having a viscosity in the range of 1,000 to 1,000,000 cps; and
    making a meniscus of the viscous substance bulge out from the orifice, applying a voltage to the electrode to pull out the viscous substance through the orifice and cutting off a portion of the viscous substance pulled out of the orifice and making the cut portion of the viscous substance adhere to a medium.

2. The viscous substance discharging method using a viscous substance dispenser according to claim 1, wherein in the step of applying the voltage to the electrode with the meniscus of the viscous substance bulging out from the orifice, and the portion of the viscous substance pulled out of the orifice is cut to make the same adhere to the medium, the positional relation with respect to a horizontal direction between the medium and the orifice is changed according to the voltage.

3. The viscous substance discharging method using a viscous substance dispenser according to claim 1, wherein the absolute value of the voltage is in the range of 100 to 20,000 V.

4. The viscous substance discharging method using a viscous substance dispenser according to claim 3, wherein the voltage is a pulse voltage.

5. The viscous substance discharging method using a viscous substance dispenser according to claim 1, wherein the portion of the viscous substance is cut by reducing the absolute value of the voltage or by stopping the application of the voltage to the electrode.

6. The viscous substance discharging method using a viscous substance dispenser according to claim 1, wherein the meniscus is made by applying a pressure to the container containing the viscous substance.

7. The viscous substance discharging method using a viscous substance dispenser according to claim 1, wherein a distance between the orifice and the medium is in the range of 0.1 to 10 mm.

8. The viscous substance discharging method using a viscous substance dispenser according to claim 1, wherein the viscous substance contains particles having a particle size not greater than ⅒ of diameter of the orifice.

9. The viscous substance discharging method using a viscous substance dispenser according to claim 1, wherein the viscous substance contains particles of a mean particle size in the range of 0.1 to 10 μm.

10. The viscous substance discharging method using a viscous substance dispenser according to claim 1, wherein the container containing the viscous substance serves also as an electrode, and the voltage is applied to the container.

11. The viscous substance discharging method using a viscous substance dispenser according to claim 1, wherein the meniscus is made by heating the container containing the viscous substance.

12. The viscous substance discharging method using a viscous substance dispenser according to claim 1, wherein the voltage is a dc voltage.

13. The viscous substance discharging method using a viscous substance dispenser according to claim 1, wherein the voltage is a dc voltage, the voltage is applied to and removed from the electrode, and the pressure is controlled to form lines of the viscous substance in a line width not grater than ½ of the diameter of the orifice or dots of the viscous substance in a diameter not greater than ½ of the diameter of the orifice.

14. The viscous substance discharging method using a viscous substance dispenser according to claim 1, wherein the voltage is an ac voltage.

15. The viscous substance discharging method using a viscous substance dispenser according to claim 14, wherein the ac voltage has a frequency in the range of 1 Hz to 100 kHz.

16. The viscous substance discharging method using a viscous substance dispenser according to claim 1, wherein the voltage is an ac voltage, the amplitude of the voltage and the pressure are controlled to form lines of the viscous substance in a line width not greater than ½ of the diameter of the orifice or to form dots of the viscous substance in a diameter not greater than ½ of the diameter of the orifice.

17. A pattern forming method using a viscous substance dispenser comprising the steps of:

arranging an electrode in a portion or an entire portion of a container of the viscous substance dispenser having a circular orifice or a polygonal orifice of a diameter in the range of 50 μm to 1 mm or at a lower portion of the container and containing a viscous substance having a viscosity in the range of 1,000 to 1,000,000 cps; and making a meniscus of the viscous substance bulge out from the orifice, applying a voltage to the electrode to pull out the viscous substance through the orifice and cutting off a portion of the viscous substance pulled out of the orifice and making the cut portion of the viscous substance adhere to a medium.

18. The pattern forming method according to claim 17, wherein the viscous substance is a fluorescent substance, and the viscous substance discharging method is used for fabricating plasma display panels, electroluminescence display panels, field emission display panels or CRTS.

19. The pattern forming method according to claim 17, wherein the viscous substance contains at least glass powder, and the viscous substance is used for forming ribs.

20. The pattern forming method according to claim 19, wherein the ribs are used for fabricating plasma displays, electroluminescence displays or field emission displays.

21. The pattern forming method according to claim 17, wherein the viscous substance contains at least a binder resin, and the viscous substance is used for fabricating a spacer for defining a liquid crystal containing space in a liquid crystal display.

22. The pattern forming method according to claim 17, wherein the viscous substance contains at least a conductive substance, and the viscous substance is used for forming an electrode pattern.

* * * * *